United States Patent [19] [11] 4,227,148
Smith [45] Oct. 7, 1980

[54] EXTERNAL MEANS FOR INCREASING THE SENSITIVITY OF A MOVING MAGNET TYPE OF METER

[75] Inventor: Leonard S. Smith, Eden Prairie, Minn.

[73] Assignee: Century Mfg. Co., Minneapolis, Minn.

[21] Appl. No.: 932,562

[22] Filed: Aug. 10, 1978

[51] Int. Cl.³ .................. G01R 15/08; G01R 1/38; G01R 5/16
[52] U.S. Cl. .................................. 324/115; 324/146
[58] Field of Search ............... 324/115, 131, 146, 133; 116/289, 291, 292

[56] References Cited

U.S. PATENT DOCUMENTS

| 2,458,805 | 1/1949 | Taylor | 324/115 X |
| 3,031,620 | 4/1962 | Finley | 324/131 |
| 3,168,689 | 2/1965 | Gelenius | 324/146 X |
| 3,460,038 | 8/1969 | Ziegler | 324/146 |
| 3,500,201 | 3/1970 | Mentzer | 324/146 |

Primary Examiner—Gerard R. Strecker
Attorney, Agent, or Firm—Leo Gregory

[57] ABSTRACT

This invention relates to the modification of a moving magnet type of a direct current reading meter wherein by the addition of an electro-magnetic coil, the permanent magnet of the meter is influenced by the magnetic field of the coil with respect to the current flow to provide a reading to indicate full scale values of a much lower current value than that of the basic movement of the meter.

4 Claims, 5 Drawing Figures

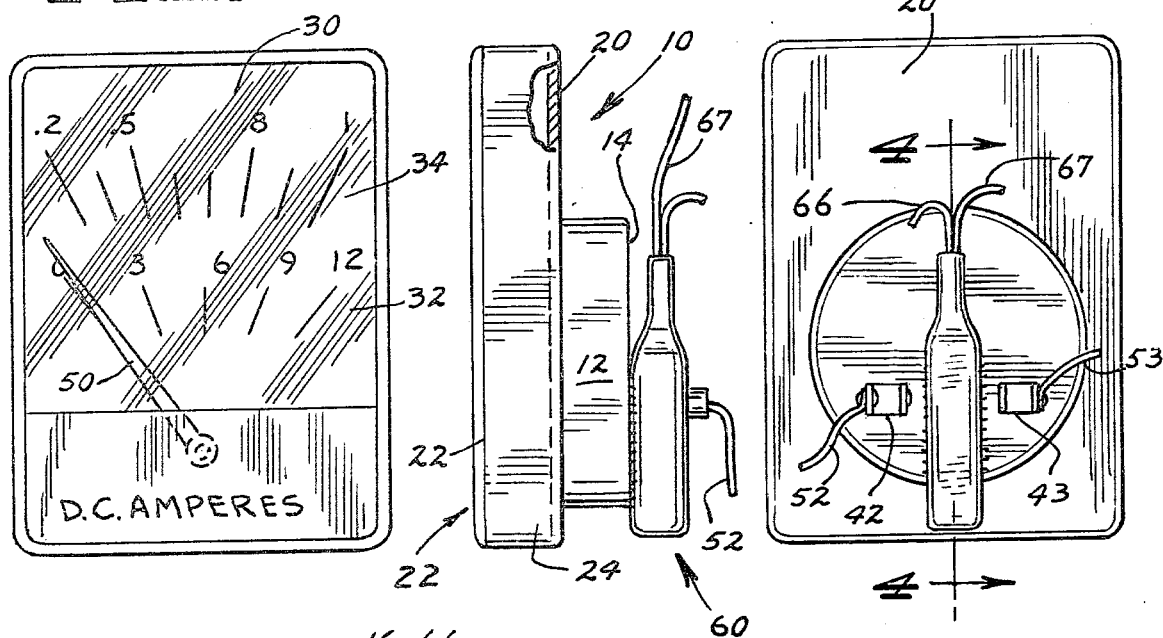
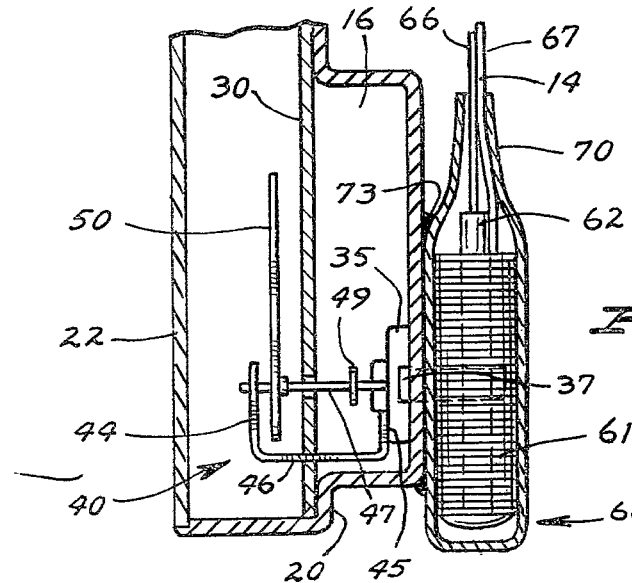
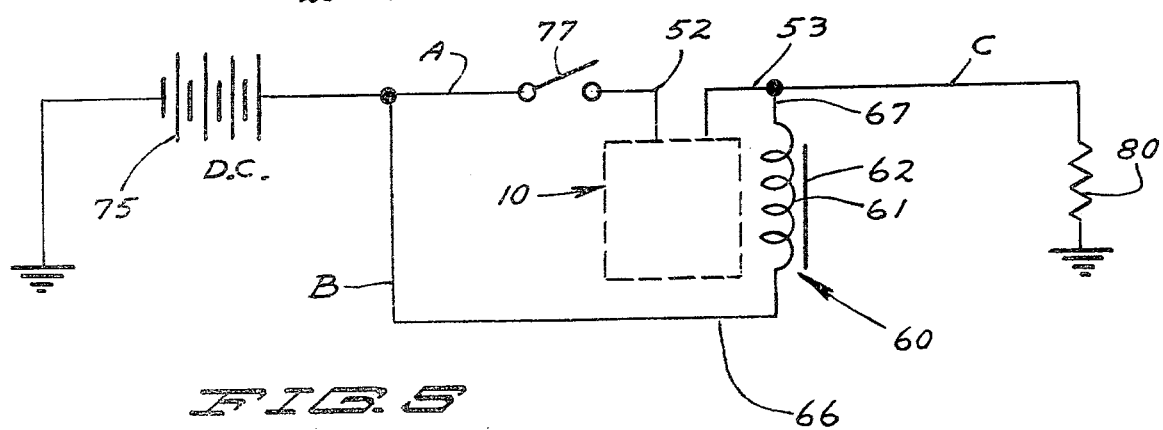

EXTERNAL MEANS FOR INCREASING THE SENSITIVITY OF A MOVING MAGNET TYPE OF METER

BACKGROUND OF THE INVENTION

1. Field of the Invention

This invention relates to the field of moving magnet meters.

2. Description of the Prior Art

A conventional ampere meter requires a specific current value for a full scale reading such as a current value of twelve amperes wherein the increments of measure of one ampere or less are such small divisions of the full scale that they are difficult to read with accuracy.

It is desirable to provide means to influence the indicator of a meter to indicate one increment of current flow, such as one ampere, by way of example, as a full scale reading.

SUMMARY OF THE INVENTION

The invention herein relates to the external modification of a moving magnet type of meter to influence the needle movement to provide a full scale reading for a value of current which is less than that which is otherwise required by the basic movement of the meter.

It is an object and the essential purpose of this invention to modify a direct current meter to externally influence the magnetic field of the meter to make the meter more sensitive to current flow than otherwise.

More specifically stated, the invention herein relates to the modification of a direct current reading meter by externally supplementing it with a coil and a magnetic core to produce a sufficient magnetic field to influence the internal magnet of the meter to make it more sensitive to current flow and to allow full scale readings of selected current values which are much lower than would otherwise be required for the basic movement of the meter.

These and other objects and advantages of the invention will be set forth in the following description made in connection with the accompanying drawings in which like reference characters refer to similar parts throughout the several views.

BRIEF DESCRIPTION OF THE DRAWINGS

FIGS. 1, 2 and 3 are views in front elevation, side elevation and rear elevation of the invention herein;

FIG. 4 is a broken view in vertical section on an enlarged scale taken on line 4—4 of FIG. 3 as indicated; and FIG. 5 is a schematic wiring diagram in connection with the device herein.

DESCRIPTION OF A PREFERRED EMBODIMENT

Referring to the drawings, a direct current ampere meter 10 is shown comprising an annular non-magnetic housing having a side wall 12, a back wall 14 and an open front 16. Extending from said side wall at the open front portion thereof is a rectangular flange 20 and overlying said flange and secured to the periphery thereof is a transparent cover 21 having a substantially rectangular front wall 22 and a side wall 24 thereabout which engages and is suitably secured as with an adhesive to the periphery of said flange. Overlying said flange is a dial 30 having thereon for purposes herein a 12 ampere scale 32 and a one ampere scale 34, the latter being disposed above the former on said dial as indicated in FIG. 1.

Disregarding the scale 34 for the moment, said meter 10 comprises a conventional 12 ampere direct current reading meter having an internal functioning mechanism and circuitry 40 consisting of an insulating supporting plate member 35 as indicated in FIG. 4, secured by tongue members 37 struck from said housing and carried on said plate member is a conductive member 41 here indicated as forming a current bar and having a pair of spaced terminals 42 and 43 projecting rearwardly of said housing through said insulating plate member as indicated in FIG. 3 and the same is secured to said insulating plate member by projecting portions thereof forming tongue members reversely bent in a conventional manner.

Said conductive member 41 has a forwardly projecting vertically disposed U-shaped portion 46 having a shaft 47 journaled between the vertical leg portions 44 and 45 thereof. Carried on said shaft 47 adjacent the leg portion 45 is a permanent magnet 49. Carried on the forward portion of said shaft 47 adjacent the leg 44 is a needle or indicator 50. Said needle and said magnet are secured to said shaft to be rigid therewith and the meter is designed to position said needle to be at rest at the lower or zero end of scale 32. In circuit with said current bar and connected to the terminals 42 and 43 are current lines 52 and 53.

As indicated, the above described meter is a conventional structure. The invention herein comprises an external addition to said meter as hereinafter described making said meter sensitive to lower values of current than otherwise.

Provided is a coil 60 having a winding 61 about a soft iron core 62 with the winding having an appropriate number of turns with respect to the particular design for which the coil is intended and the winding 61 of said coil has leads 66 and 67 which typically would be connected as shown in the wiring diagram FIG. 5.

Said coil 60 is suitably encapsulated as indicated at 70 and the same is secured to said rear wall 14 as by a suitable adhesive 73.

With reference to the wiring diagram, a direct current source 75 is indicated and running therefrom is a circuit A-C including the meter 10 and having a suitable switch 77 controlling the current flow through said meter and onto a load 80.

The alternate circuit running from said current source 75 is the circuit B-C which includes the coil 60. The circuit B-C when the switch 77 is open will be energized and will by-pass the internal circuitry of the meter 10 and by energizing the coil 60 will create a magnetic force external of the meter 10 as will be described.

OPERATION

The purpose of the invention herein is to provide a DC current reading meter which by a magnetic coupling can be influenced externally in a very simple and positive manner to read current values below that which would otherwise be required for the basic movement of the meter. Thus, by way of example, the meter 10 prior to its modification as described above requires a current flow of 12 amperes for a full scale reading of the scale 34 and a current flow of one ampere or less would result in a reading of a small incremental division of the scale. Thus in using the meter in connection with a battery charger such as for charging a battery which might require one ampere of current flow or less, it would be difficult to indicate the value of the current flowing in a situation wherein it would be important to have a precise reading such as of one ampere or less.

With reference to the scale 34 said meter 10 can be caused to provide a full scale reading of to one ampere of current flow.

Referring to the schematic wiring diagram of FIG. 5, with the switch 77 in closed position, the current flow from the current source 75 would go through the circuit A-C which includes the meter 10 and onto the load 80 which for purposes herein could be the charging of a 12 ampere automobile battery. If instead of an automobile battery the load 80 represented a motorcycle battery or even a smaller wet cell battery, the switch 77 would be opened and the current path from the current source 75 would by-pass the meter 10 and pass through the circuit B-C having in series therewith, the coil member 60 and the load 80. This circuit by-passes the meter 10, as is readily seen. Here with a current flow of one ampere, the coil 60 being appropriately designed as to its windings creates a magnetic force field with magnetic coupling lines which influence the moving magnet 49 of the meter 10 to cause said magnet to move the needle 50 to provide a full scale reading of one ampere of current on the scale 34.

The above described magnetic force field is a very simple and effective modification of the needle reading of the meter 10 requiring no wired connection with the internal circuitry or mechanism of the meter but instead provides an external influence of a magnetic force field for the internal magnet of the meter.

The meter 10 virtually has a zero resistance and the coil member 60 has a high resistance whereby when the switch 77 is closed, the current shunted to the coil member 60 is insufficient to energize said coil member to create a magnetic force field that will have any significant influence on moving the magnet 49. Said coil member 60 requires the full current flow from said current source 75 to influence said moving magnet 49 to provide the full scale reading above described.

The switch 77 is not shown in connection with the FIGS. 1-4 but its use is external thereto and it is believed that the showing in the schematic wiring diagram is sufficient. The particular number of windings about the core 62 is a matter of design to cause a full scale reading of whatever value of current may be desired which is less than the value of current required for a full scale reading of the scale 32.

The invention herein has proved to be a simple, expeditious and very successful modification of an otherwise conventional meter and has proved to be altogether successful in operation.

It will of course be understood that various changes may be made in the form, details, arrangement and proportions of the product without departing from the scope of applicant's invention.

What is claimed is:

1. External means influencing the basic movement of a DC ampere reading meter, having in combination
    a conventional DC ampere reading meter including a housing having mounted therein a moving magnet, a scale and a needle caused by said magnet to be moved to indicate a scale reading, a switch in series with said meter
    a current source in circuit with said series connected switch and meter,
    the improvement herein comprises
    a coil member,
    means mounting said coil member upon said housing externally thereof,
    said coil member including
    a soft iron core and
    a coil of appropriate windings about said core and connected across the series combination of said switch and meter,
    said current source being in circuit with said coil member and by-passing said meter with said switch in open position,
    the position of said coil member on said housing and the winding of said coil about said core being such that said current source energizes said coil member and creates a magnetic force field with magnetic coupling lines influencing said moving magnet to cause said needle to move such as to give a full scale reading to a current value which is less than the current value otherwise required for the basic movement of said meter with said switch in closed position the resistance of the coil being of such greater magnitude than the meter resistance that the current drawn by said coil causes no significant influence on the moving magnet with the switch in said closed position.

2. The structure set forth in claim 1, including encapsulating said coil member.

3. The structure set forth in claim 1, including
    a basic movement scale,
    a scale having indicia indicating lower values of current than that of said basic movement scale,
    whereby, said coil magnetically influences said moving magnet to provide a full scale reading on said scale of lower current values.

4. The structure set forth in claim 1, wherein
    said coil and said meter respectively are included in circuits having a common current source,
    said circuit including said coil by-passing said meter, and
    means selectively energizing said circuits.

* * * * *